United States Patent
Wong

(10) Patent No.: US 6,384,366 B1
(45) Date of Patent: May 7, 2002

(54) TOP INFRARED HEATING FOR BONDING OPERATIONS

(75) Inventor: Pak C. Wong, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/592,275

(22) Filed: Jun. 12, 2000

(51) Int. Cl.$^7$ ................................................ B23K 1/005
(52) U.S. Cl. ........................ 219/85.12; 219/85.13; 228/180.5; 228/230; 228/232
(58) Field of Search ............................ 219/85.12, 85.13, 219/85.14, 85.15, 85.18; 228/122.1, 123.1, 180.5, 227, 228, 230, 232, 244, 4.5

(56) References Cited

U.S. PATENT DOCUMENTS

| | | | |
|---|---|---|---|
| 4,170,326 A | * 10/1979 | Wright | |
| 4,915,565 A | * 4/1990 | Bond et al. | |
| 5,305,944 A | 4/1994 | Yoshida et al. | |
| 5,346,857 A | 9/1994 | Scharr et al. | |
| 5,364,011 A | * 11/1994 | Baker et al. | |
| 6,041,994 A | * 3/2000 | Hwang et al. | |
| 6,234,374 B1 | * 5/2001 | Hwang et al. | |

FOREIGN PATENT DOCUMENTS

| | | | |
|---|---|---|---|
| GB | 2 244 374 | | 11/1991 |
| JP | 55065443 | * | 5/1980 |
| JP | 61 168233 | | 7/1986 |
| JP | 02096394 | * | 4/1990 |
| JP | 02 310939 | | 12/1990 |
| JP | 04 151844 | | 5/1992 |
| JP | 05109811 | * | 4/1993 |
| JP | 05243722 | * | 9/1993 |
| JP | 05 335377 | | 12/1993 |

* cited by examiner

*Primary Examiner*—Tom Dunn
*Assistant Examiner*—Colleen P. Cooke

(57) ABSTRACT

A method and apparatus are provided for reliably heating the bonding areas of a substrate and/or a die or dies of a stacked die assembly or a flip-chip assembly to ensure high-quality solder or wire bonds between the substrate and the die. Embodiments include heating the wire bonding areas of the dies of a stacked die package with infrared radiation with an infrared lamp or gun directed towards the top surfaces of the dies before and during the wire bonding process, or heating the bonding pad area of the top surface of a substrate to which a flip-chip is to be mounted from above with infrared radiation from a lamp or gun to the desired temperature, then bonding the flip-chip to the substrate. The use of infrared radiant heating directed at the top surfaces of the dies and/or the substrate ensures that their respective bonding areas are heated to the proper temperature within the necessary time period, thereby enabling high-quality wire bonding or die bonding, and increasing yield.

16 Claims, 2 Drawing Sheets

TOP INFRARED HEATING FOR BONDING OPERATIONS

FIELD OF THE INVENTION

The present invention relates to a method and apparatus for heating semiconductor devices and circuit boards during assembly operations. The present invention has particular applicability in wire bonding of stacked die assemblies and in flip-chip bonding.

BACKGROUND ART

In conventional stacked die packaging techniques, a first die is attached to a substrate, such as a metal lead frame or a laminated plastic or ceramic circuit board, as with epoxy or polyimide paste or film tape, and a second die is attached to the top surface of the first die, also with epoxy or polyimide paste or film tape. A wire bonding operation is then carried out, wherein gold or copper wires are fused to bonding pads on the top surfaces of the substrate and the dies, typically using ultrasonics and heat. To raise the substrate and dies to the proper temperature for wire bonding, typically about 190 degrees Centigrade, a heater block is commonly employed to conductively pre-heat the substrate from the bottom. In other words, although the wire bonding (i.e., soldering of the wire ends) occurs on the top surfaces of the substrate and the dies, they are heated from the bottom.

While pre-heating the substrate from the bottom using a heater block yields satisfactory results when the substrate is a thin metal lead frame having good heat conductivity, such as a copper lead frame, this conventional methodology is problematic for other types of substrates. In particular, thick laminated plastic or ceramic substrates that are slower to heat up may not be brought up to the proper temperature for wire bonding by the block heater within the available time period for pre-heating (e.g., about 4 seconds or less, depending on the speed of the wire bonder and the number of wires per die assembly). Moreover, since the dies are remote from the bottom of the substrate, their bonding areas heat up even more slowly than the substrate, and thus are less likely to be brought up to the preferred wire-bonding temperature by the block heater. Consequently, wire bond quality and manufacturing yield are adversely affected.

An analogous problem also exists in conventional flip-chip assembly methodology, wherein a semiconductor die is soldered directly onto the top surface of a substrate, typically a plastic or ceramic circuit board. Bonding pads on the substrate are coated with solder, and solder preforms called "solder bumps" are attached to the die prior to assembly. Heat and pressure are used to melt the solder on both the substrate and the die to bond the die to the substrate. A typical flip-chip assembly technique employs a heater block, as discussed above, to pre-heat the substrate to partially melt the solder bumps. However, as in the case of the stacked die assembly, the heater block may not raise the temperature of the substrate top surface and the solder bumps quickly enough to ensure high-quality solder connections between the die and the substrate, thereby adversely affecting yield and reliability.

There exists a need for a methodology for ensuring adequate heating of flip-chip and wire bonding dies and substrates, thereby improving manufacturing yield and lowering costs.

SUMMARY OF THE INVENTION

An advantage of the present invention is a method and apparatus for reliably heating the bonding areas of a substrate and/or a die or dies to ensure high-quality solder or wire bonds between the substrate and the dies.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of heating a bonding area of a top surface of a semiconductor die attached to a substrate, the method comprising heating the bonding area with infrared radiation directed at the top surface of the die.

Another aspect of the present invention is an apparatus for carrying out the above inventive method.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for wire bonding stacked die packages and for assembling flip-chip packages do not reliably heat the bonding areas of the substrate and/or the dies to the proper temperature for forming high-quality solder joints or wire bonds, thereby reducing manufacturing yield. The present invention addresses and solves these problems stemming from conventional manufacturing processes.

According to the methodology of one embodiment of the present invention, the wire bonding areas of the dies of a stacked die package are heated with infrared radiation, as with a conventional infrared lamp or gun directed towards the top surfaces of the dies before and during the wire bonding process. In addition, wire bonding areas of the substrate can also be heated from above with infrared radiation. Moreover, the bottom of the substrate can be pre-heated using a conventional conductive heater block. The inventive use of infrared radiant heating directed at the top surfaces of the dies and the substrate ensures that their respective wire bonding areas are heated to the proper wire-bonding temperature (i.e., about 190 degrees Centigrade) within the necessary time period, such as about 4 seconds or less, thereby enabling high-quality wire bonding and increasing wire bonding yield.

According to another embodiment of the present invention, the bonding pad area of the top surface of a substrate to which a flip-chip is to be mounted is heated from above with infrared radiation from a lamp or gun to the desired temperature, such as about 200 degrees Centigrade. The flip-chip is then bonded using pressure and the infrared heating. Additionally, the bottom of the substrate can be pre-heated using a conventional conductive heater block. Thus, the present invention ensures that the solder on the substrate is at the proper temperature for flip-chip bonding before and during the bonding operation. As a result, the quality of the solder bonds between the flip-chip and the substrate is improved.

Figure 1:
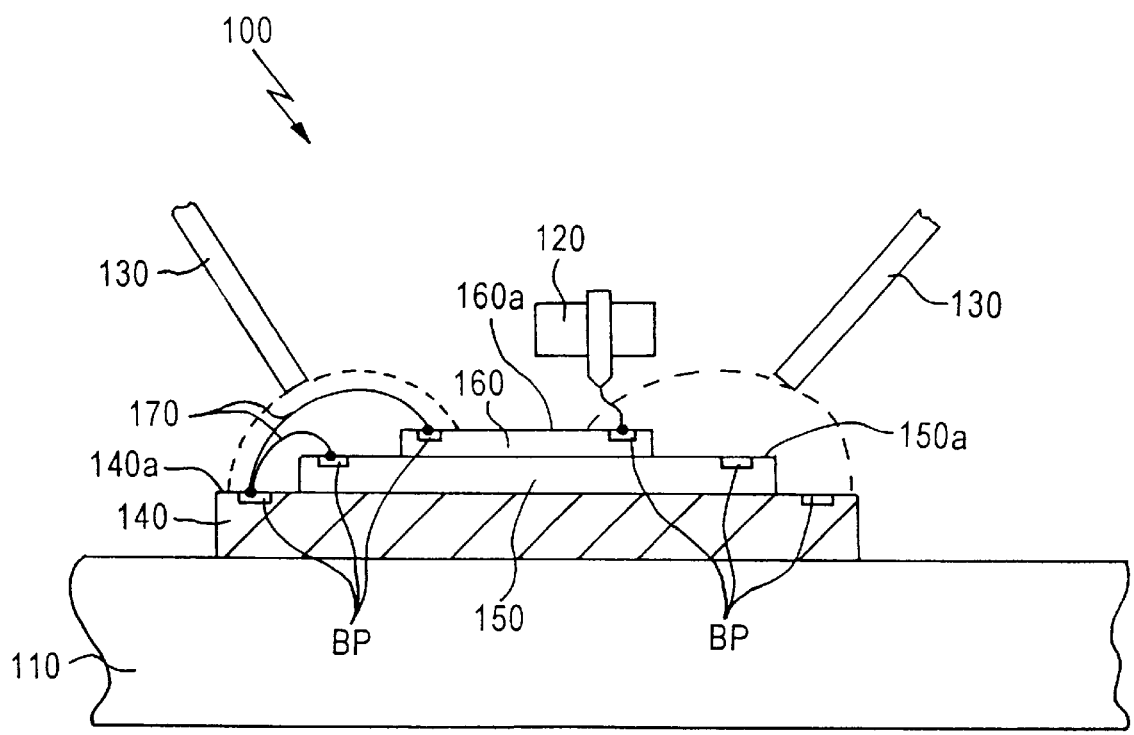
FIG. 1 is a side view of an apparatus according to an embodiment of the present invention.

An embodiment of the present invention is illustrated in FIG. 1. An inventive apparatus 100 for wire bonding, based on a conventional wire bonder such as a Model 8028 wire bonder, available from Kulicke and Soffa Industries, Inc. of Willow Grove, Pa., comprises a conventional conductive block heater 110, a conventional wire bonding head 120, and infrared heaters 130. A conventional stacked die package structure to be wire bonded using the inventive method and apparatus comprises a substrate 140, such as a ceramic or laminated plastic circuit board, a lower semiconductor die 150 and an upper semiconductor die 160, typically assembled to each other with an epoxy adhesive (not shown).

Infrared heaters 130 are positioned above the package structure to be wire bonded for heating top surface 150a of die 150, top surface 160a of die 160, each of which include bonding pads BP, and a "bonding area" of substrate 140; that is, the portion of top surface 140a of substrate 140 having bonding pads BP. Heaters 130 are conventional infrared lamps or guns, or can be specially designed infrared heaters optimized for operation in the limited space available at wire bonder 100. For example, a flexible fiber optic tube can be used to direct infrared radiation toward substrate 140 and dies 150, 160.

The intensity and wavelength of infrared heaters 130 is application specific. The intensity is preferably such that the desired temperature profile is achieved; e.g., the temperature of die top surfaces 150a, 160a and the bonding area of substrate 140 reaches the wire bonding temperature of about 190 degrees Centigrade within the necessary ramp-up time of about 4 seconds or less, depending on the speed of wire bonder 100 and the desired throughput. The wavelength of the infrared radiation is determined by the materials to be heated, since some infrared wavelengths are not absorbed by some materials (i.e., they will not heat the material). Therefore, it can be necessary or desirable to provide infrared radiation of different wavelengths for heating dies 150, 160 (made mainly of silicon) and substrate 140 (made of plastic or ceramic).

Conductive heater 110 can be used in conjunction with infrared heaters 130 to facilitate achievement of the desired wire bonding temperature and temperature profile, depending on the stacked die package. For example, if the stacked die package 100 to be wire bonded comprises a ceramic or plastic substrate 140, conductive heater 110 is preferably used to pre-heat the package, and infrared heaters 130 are used as described above to heat the bonding areas of the substrate 140 and the dies 150, 160. However, if the stacked die package 100 comprises a metal lead frame substrate 140, infrared heaters 130 can be directed to heat die surfaces 150a, 160a, but are not needed to heat substrate surface 140a, since conductive heater 110 alone can adequately heat the thin metal substrate.

In operation, the stacked die package is pre-heated by conductive heater 110, such as while another package is being wire bonded, then moved into position under wire bonding head 120. Infrared heaters 130 then operate to heat the areas of substrate 140 and dies 150, 160 comprising bonding pads BP to about 190 degrees Centigrade while bonding head 120 attaches wires 170 to bonding pads BP. Since bonding pads BP are adequately heated by conductive heater 110 and/or infrared heaters 130, wires 170 are reliably bonded to bonding pads BP.

Figure 2A:
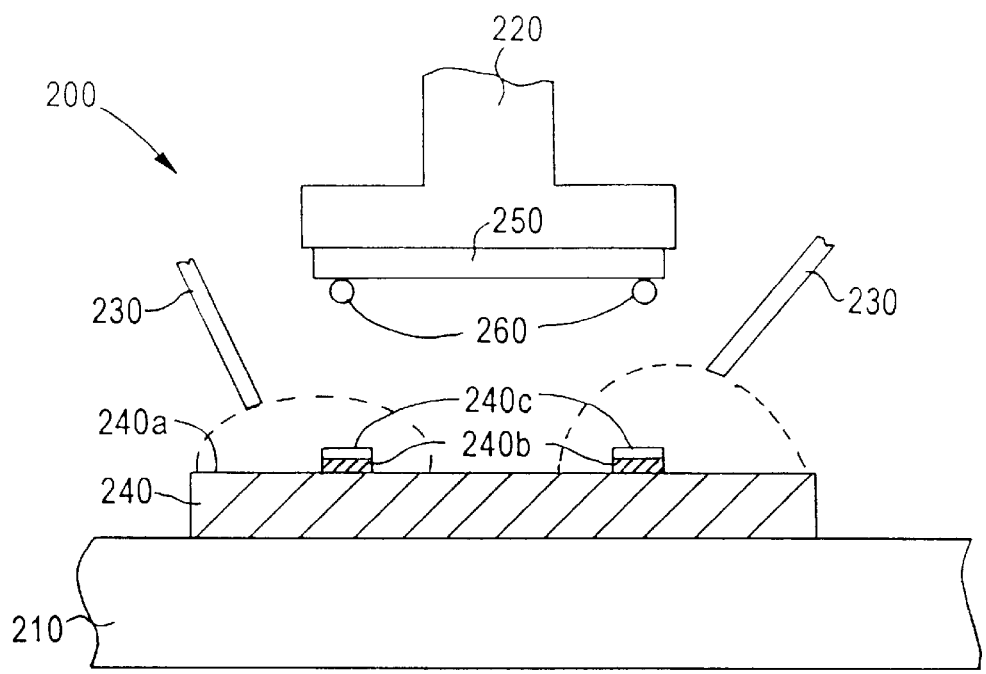
FIGS. 2A–2B schematically illustrate sequential phases of a method in accordance with an embodiment of the present invention.
Figure 2B:
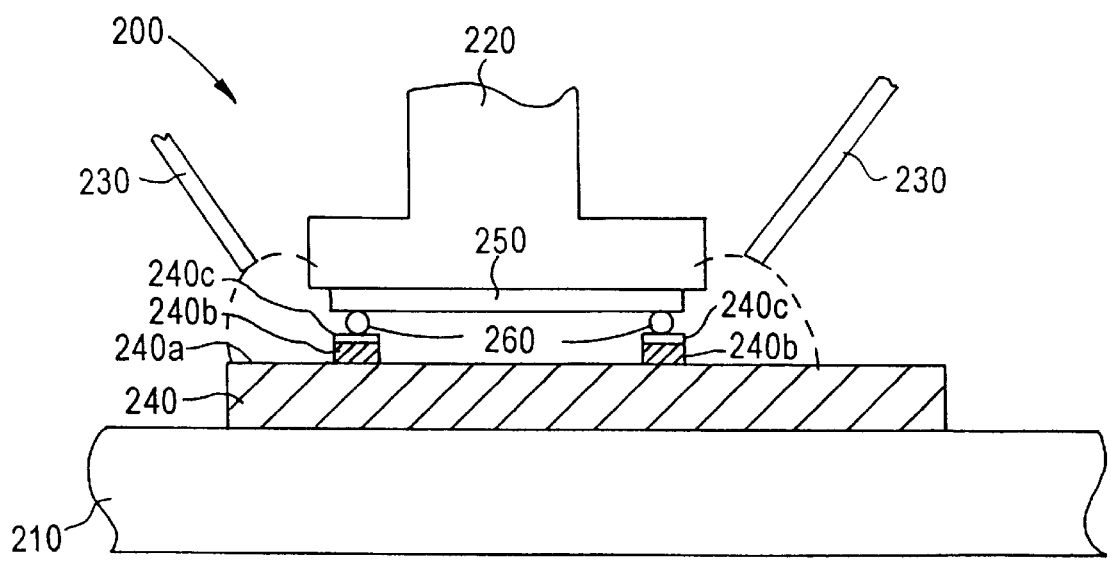

Another embodiment of the present invention is illustrated in FIGS. 2A and 2B. An inventive apparatus 200 for flip-chip bonding, based on a conventional flip-chip die bonder such as a Model Micron 2, available from ESEC of Switzerland, comprises a conventional conductive heater 210, conventional bonding head 220 and infrared heaters 230. A conventional flip-chip substrate 240 to be bonded to a flip-chip die 250 is shown at die bonder 200, such as a ceramic or laminated plastic circuit board.

Infrared heaters 230 are positioned above substrate 240 for heating top surface 240a of substrate 240, which includes bonding pads 240b covered with solder 240c, prior to compressing die 250 onto substrate 240. As in the above-described embodiment, heaters 230 are conventional infrared lamps or guns, or can be specially designed infrared heaters optimized for operation in the limited space available at die bonder 200. As previously discussed, the intensity and wavelength of infrared heaters 230 is determined such that the desired temperature profile is achieved; e.g., the temperature of substrate top surface 240a reaches the bonding temperature of about 200 degrees Centigrade within the necessary ramp-up time of, e.g., about 0.66 seconds, depending on the speed of die bonder 200 and the desired throughput. The wavelength of the infrared radiation is determined by the material of substrate 240. Conductive heater 210 is used in conjunction with infrared heaters 230 to facilitate achievement of the desired die bonding temperature and temperature profile.

Referring now to FIG. 2A, in operation, substrate 240 is pre-heated by conductive heater 210, such as while another assembly is being die bonded, then moved into position under die bonding head 220, which is carrying flip-chip 250 comprising solder bumps 260 corresponding to bonding pads 240b. Infrared heaters 230 then operate to heat top surface 240a, including bonding pads 240b, to about 200 degrees Centigrade to at least partially melt solder 240c on bonding pads 240b. Die bonding head 220 then descends (see FIG. 2B) and presses bonding pads 240b to solder bumps 260. Solder bumps 260 then melt with solder 240c covering bonding pads 240b to bond flip-chip 250 to substrate 240. Since bonding pads 240b are adequately heated by conductive heater 210 and infrared heaters 130 prior to die bonding, the quality of the connections between flip-chip 250 and bonding pads 240b is high, resulting in improved manufacturing yield and reliability.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of heating a bonding area of a top surface of a semiconductor die attached to a substrate, the method comprising heating the bonding area with infrared radiation directed at the top surface of the die to about 190 degrees Centigrade in about 4 seconds or less.

2. The method of claim 1, comprising directing the infrared radiation at a bonding area of a top surface of the substrate.

3. The method of claim 1, comprising heating the bonding area to about 190 degrees Centigrade.

4. The method of claim 1, comprising attaching wires to the bonding area while the infrared radiation is directed at the top surface of the die.

5. The method of claim 1, comprising heating the substrate prior to directing the infrared radiation to the top surface of the die.

6. The method of claim 4, comprising heating the bonding area to about 190 degrees Centigrade prior to or during the attachment of the wires.

7. The method of claim 5, comprising heating the bonding area to about 190 degrees Centigrade prior to or during the attachment of the wires.

8. The method of claim 2, comprising conductively heating the substrate from a bottom surface of the substrate.

9. A method of assembling a flip-chip to a substrate, comprising:

heating a bonding area of a top surface of the substrate with infrared radiation directed at the top surface, wherein the bonding area comprises solder;

placing a flip-chip comprising solder on the bonding area; and compressing the flip-chip and the substrate to melt the solder of the bonding area and the solder of the flip-chip and adhere the flip-chip to the substrate.

10. The method of claim 9, comprising heating the bottom surface of the substrate.

11. The method of claim 10, comprising heating the substrate to about 200 degrees Centigrade.

12. An apparatus for heating a bonding area of a top surface of a semiconductor die attached to a substrate, the apparatus comprising:

an infrared heater for heating the bonding area with infrared radiation directed at the top surface of the die; and a second heater for heating a bottom surface of the substrate;

wherein the infrared heater and the second heater are for heating the bonding area to about 190 degrees Centigrade in about 4 seconds or less.

13. The apparatus of claim 12, wherein the second heater is a conductive heater.

14. The apparatus of claim 12, wherein the infrared heater is also for heating a bonding area of a top surface of the substrate.

15. The apparatus of claim 12, comprising a wire bonder for attaching wires to the bonding area and the substrate.

16. The apparatus of claim 12, wherein the infrared heater comprises a infrared lamp or gun.

* * * * *